(12) United States Patent
Shen

(10) Patent No.: US 10,833,083 B2
(45) Date of Patent: Nov. 10, 2020

(54) POWER DEVICE STRUCTURE WITH IMPROVED RELIABILITY AND EFFICIENCY

(71) Applicant: SYNAPTICS INCORPORATED, San Jose, CA (US)

(72) Inventor: Dan Shen, Irvine, CA (US)

(73) Assignee: SYNAPTICS CORPORATION, San Jose, CA (US)

( * ) Notice: Subject to any disclaimer, the term of this patent is extended or adjusted under 35 U.S.C. 154(b) by 0 days.

(21) Appl. No.: 15/946,688

(22) Filed: Apr. 5, 2018

(65) Prior Publication Data

US 2019/0312033 A1    Oct. 10, 2019

(51) Int. Cl.

| | | |
|---|---|---|
| H01L 29/06 | (2006.01) | |
| H01L 27/092 | (2006.01) | |
| H01L 29/10 | (2006.01) | |
| H01L 21/8238 | (2006.01) | |
| H03F 3/217 | (2006.01) | |
| H03F 3/185 | (2006.01) | |
| H02M 3/155 | (2006.01) | |

(52) U.S. Cl.
CPC .. *H01L 27/0921* (2013.01); *H01L 21/823892* (2013.01); *H01L 29/0619* (2013.01); *H01L 29/1083* (2013.01); *H02M 3/155* (2013.01); *H03F 3/185* (2013.01); *H03F 3/2173* (2013.01); *H03F 2200/03* (2013.01)

(58) Field of Classification Search
CPC .................................................. H01L 29/0619
USPC ......................................................... 257/409
See application file for complete search history.

(56) References Cited

U.S. PATENT DOCUMENTS

| | | |
|---|---|---|
| 7,005,708 B2 | 2/2006 | Mergens et al. |
| 7,838,924 B2 | 11/2010 | Boselli et al. |
| 8,530,298 B2 | 9/2013 | Roybal et al. |
| 8,981,490 B2 | 3/2015 | Nandakumar |
| 9,502,399 B1 | 11/2016 | Smith et al. |
| 2013/0265086 A1* | 10/2013 | Chang ................. H01L 29/0657 327/109 |

* cited by examiner

*Primary Examiner* — Hsin Yi Hsieh
(74) *Attorney, Agent, or Firm* — Haynes and Boone, LLP

(57) ABSTRACT

Systems and methods according to one or more embodiments are provided for improved reliability and efficiency of high side power stage output drivers used in switching amplifiers. In one example, a system includes a power device structure comprising an nwell structure formed within a semiconductor p substrate and a pwell structure formed within the nwell structure. The system further includes one or more NMOS electronic power devices formed on the pwell structure and a pwell guardring formed on the pwell structure configured to surround the one or more NMOS electronic power devices. The system further includes an nwell guardring formed on the nwell structure configured to surround the pwell structure and a p+ guardring formed on the nwell structure configured to surround the nwell guardring.

10 Claims, 11 Drawing Sheets

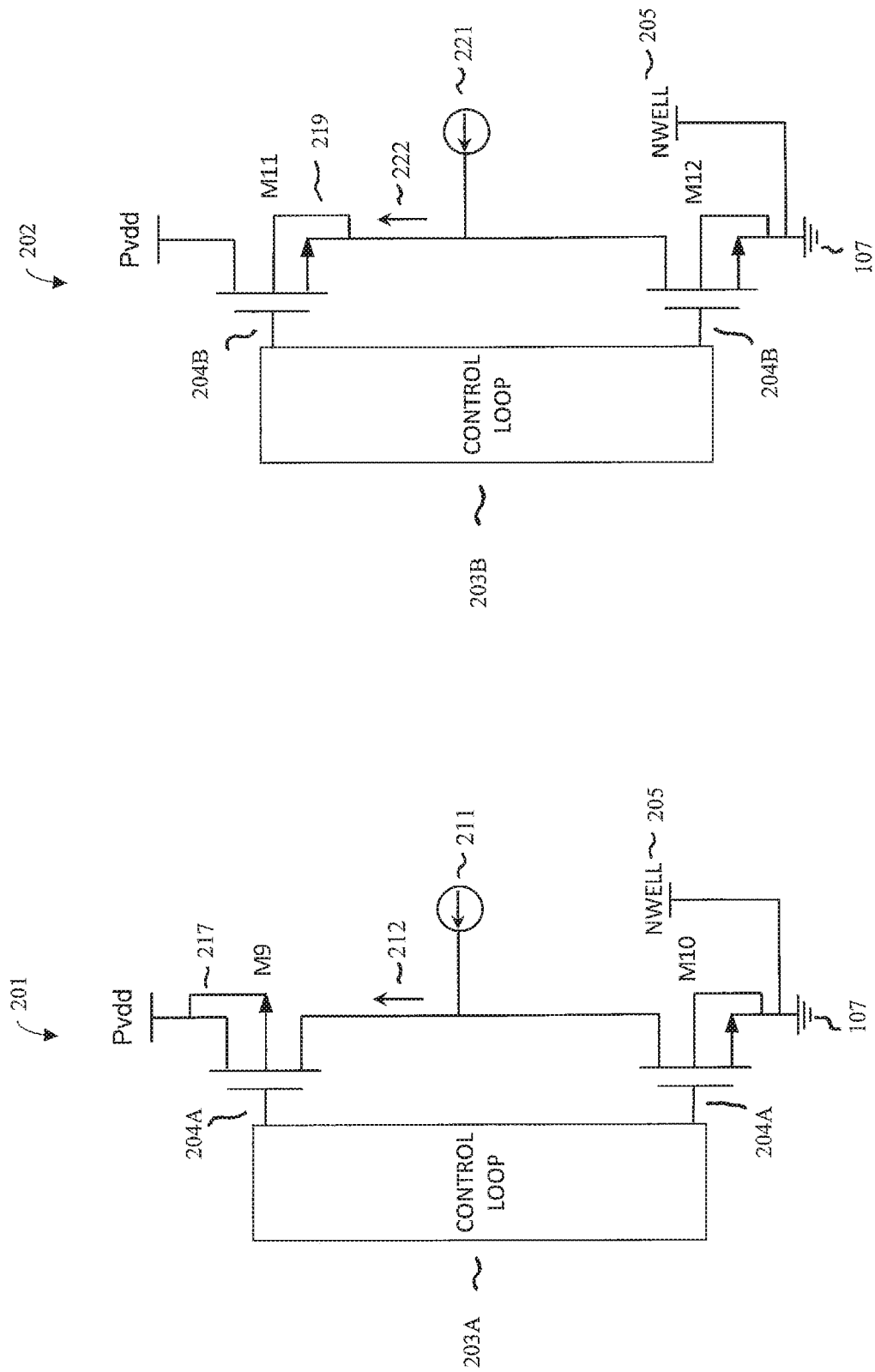

US 10,833,083 B2

POWER DEVICE STRUCTURE WITH IMPROVED RELIABILITY AND EFFICIENCY

TECHNICAL FIELD

The present disclosure, in accordance with one or more embodiments, relates generally to power devices and, more particularly for example, to improving reliably and efficiency of power device structures in switching amplifiers.

BACKGROUND

Many modern devices such as laptop computers, computer tablets, MP3 players, and smart phones use switching amplifiers. In many applications, these devices utilize switching amplifiers, such as switching DC-DC converters or Class D amplifiers, to provide for amplification of an audio signal to drive a speaker, for example. Essential to the DC-DC converter or Class D amplifier is the power stage output driver. Due to miniaturization of modern devices and limitations in thermal dissipation caused by miniaturization, current power devices may fail leading to catastrophic system failures, such as battery failure or the device overheating. Thus, there is a continued need to improve the efficiency of the power stage output driver to increase battery life and reliability of modern devices that incorporate switching DC-DC converters or Class D amplifiers.

SUMMARY

The present disclosure provides systems and methods that address a need in the art for improved reliability and efficiency of high side power stage output drivers used in switching amplifiers. The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

FIGS. 2A-B illustrate schematic diagrams of exemplary high side power stage output drivers in accordance with one or more embodiments of the disclosure.

DETAILED DESCRIPTION

The present disclosure describes systems and methods that address a need to improve efficiency of an audio amplifier switching power stage output driver used in modern devices to increase reliability and battery life. In one embodiment, an audio system of the present disclosure includes a switching amplifier H-bridge high side power stage output driver surrounded by an additional $p^+$ guardring. The additional $p^+$ guardring diverts currents formed by an inductive speaker load during "off" cycles to improve reliability and efficiency within the high side power stage output driver by reducing power and thermal dissipation.

Embodiments of the present disclosure may be contrasted to pre-existing solutions for reducing power and thermal dissipation at a high side power stage output driver of a switching regulator or class-D switching amplifier. For example, a conventional switching amplifier may add space between power stage output drivers to compensate for currents caused by switching inductive speaker loads, for example. Many switching amplifier power output stages experience reduced efficiency and reliability in the operation of an H-bridge amplifier output stage through additional power dissipation losses within the system. Moreover, added power dissipation may cause thermal issues for applications that include switching amplifier circuits formed within an integrated circuit die. Various embodiments of the present invention address these issues to efficiently reduce power and thermal dissipation within a switching amplifier integrated circuit by adding a $p^+$ guardring structure around the high side power stage output driver to divert currents formed when driving inductive loads.

Figure 1A:
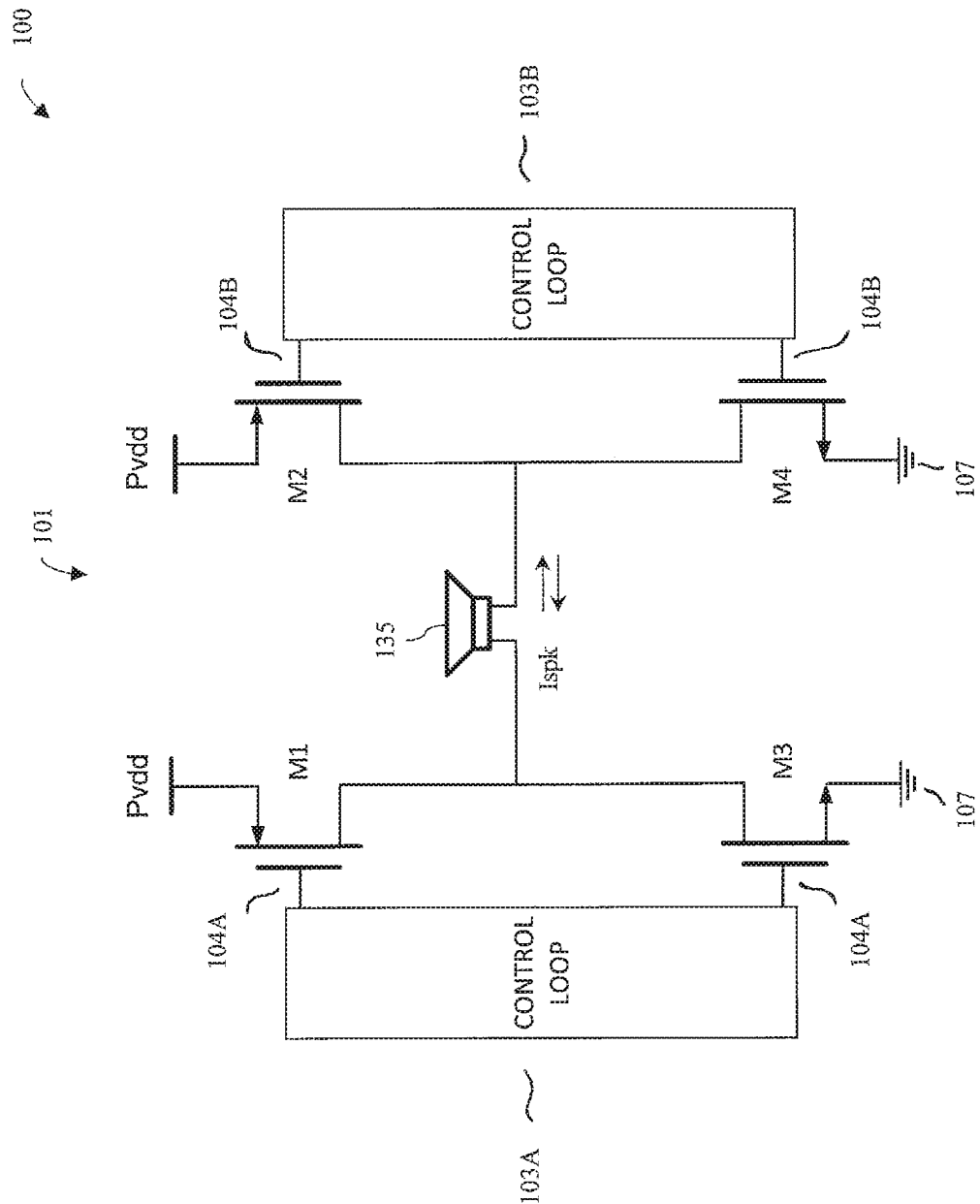
FIGS. 1A-C illustrate schematic diagrams of exemplary switching and DC-DC converter amplifier power stage output drivers in accordance with one or more embodiments of the disclosure.
Figure 1C:
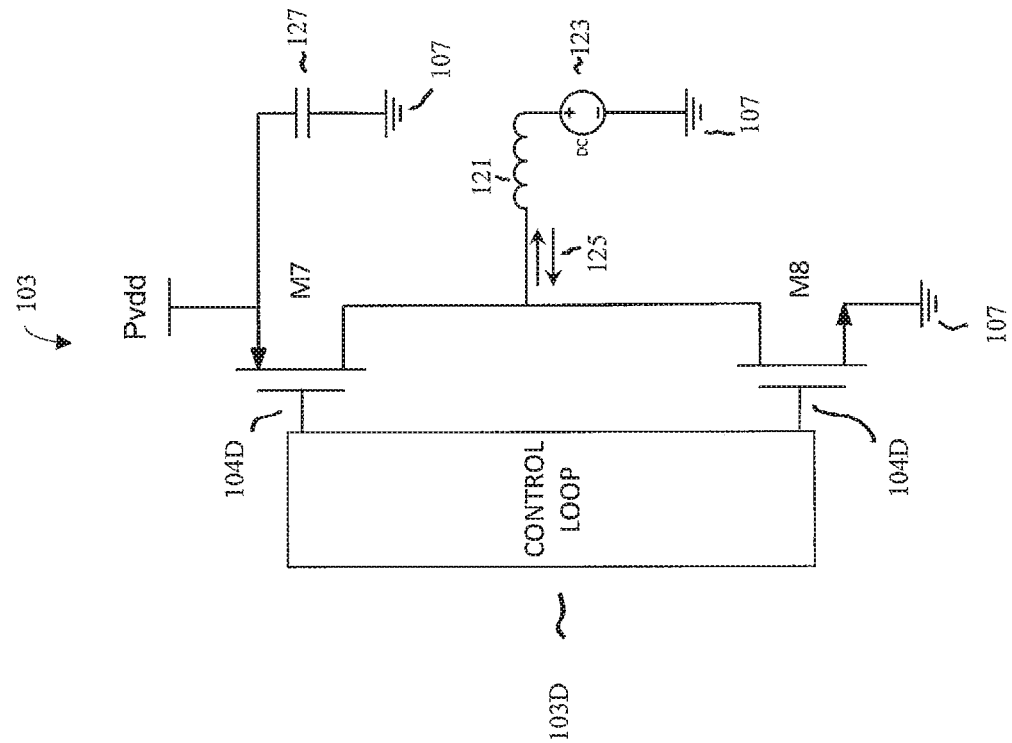
Figure 1B:
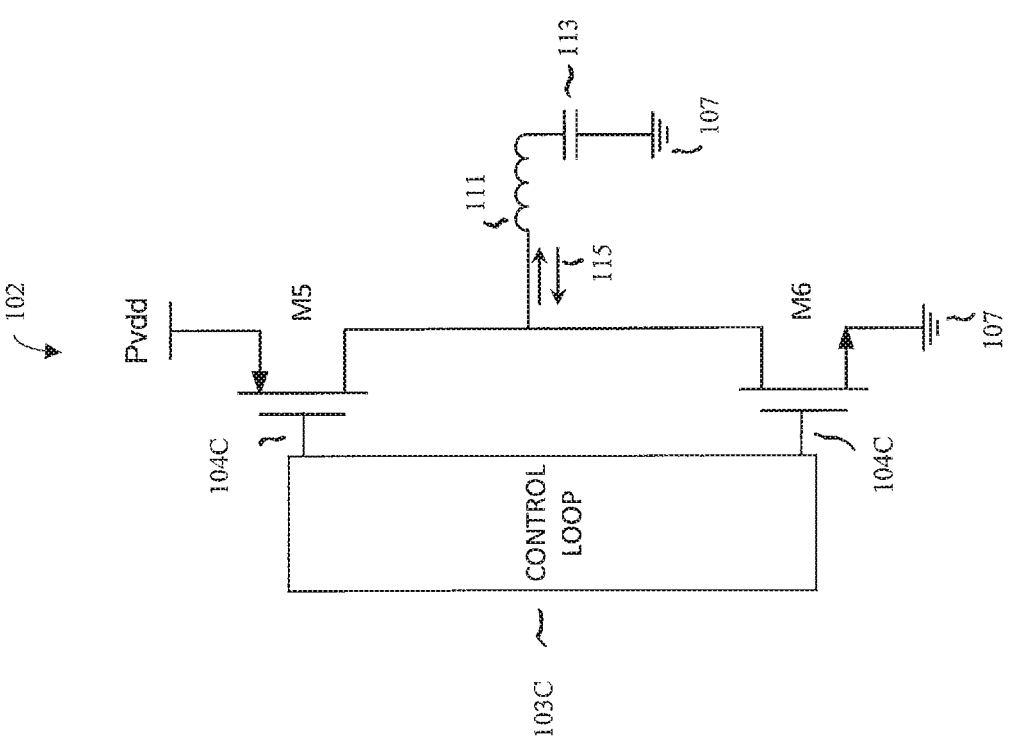

FIGS. 1A-C illustrate schematic diagrams of exemplary switching amplifier and DC-DC converter power stage output drivers in accordance with one or more embodiments of the disclosure. In some embodiments, an audio amplifier 100 of FIG. 1A forms part of an audio codec circuit. Audio amplifier 100 provides an audio amplifier power stage output driver 101 to drive an inductive speaker load 135, which may be implemented in a mobile phone, laptop computer, tablet, audio/video system, or other similar device. As illustrated, audio amplifier power stage output driver 101 is implemented as a class-D amplifier H-bridge.

As shown in FIG. 1A, in some embodiments, audio amplifier power stage output driver 101 includes two p-channel laterally diffused metal oxide semiconductor field-effect transistors (PMOS) high side power stage output drivers M1 and M2, and two n-channel laterally diffused metal oxide semiconductor field-effect transistors (NMOS) low side power stage output drivers M3 and M4. In other embodiments, power stage output drivers M1, M2, M3, and M4 may be formed as complementary metal oxide semiconductor field-effect (CMOS) transistors. The respective sources of the two high side transistors M1, M2 are connected to a supply voltage Pvdd. In some embodiments, supply voltage Pvdd provides twelve volts DC power to transistors M1, M2. However, other power supply voltages may be provided in other embodiments (e.g., such as voltages up to thirty volts DC or more). The respective drains are connected to drains of two low side transistors M3, M4 whose sources are connected to ground 107. An inductive speaker load 135 is connected between transistor switch pairs M1, M3 and M2, M4.

Control loops 103A and 103B of FIG. 1A may provide pulse width modulated control signals 104A and 104B to gates of transistors M1, M3, and M2, M4, respectively. In some embodiments, a first pulse width modulated (PMW) control signal 104A is connected to a gate terminal of transistor M1, a second PMW control signal 104A is connected to a gate terminal of transistor M3, a third PMW control signal 104B is connected to a gate terminal of transistor M2, and a fourth PMW control signal 104B is connected to a gate terminal of transistor M4. Current flows in two directions based on a switching cycle of switching PWM signals 104A-B driving M1-M4. In a stage of the switching cycle when M1 and M3 are both "off", speaker current Ispk continues to flow through M1 and may cause an increase in local thermal dissipation within M1, resulting in an increase in temperature within M1. During a stage of the switching cycle when M2 and M4 are both "off", speaker current Ispk continues to flow through M2 and may cause an increase in local thermal dissipation within M2. The present invention reduces such local thermal dissipation within high side power stage output drivers M1 and M2, as discussed further herein.

FIG. 1B illustrates a power stage output driver 102 implemented in a buck converter. Construction of power stage output driver 102 is similar to construction of audio amplifier power stage output driver 101. In this regard, M5 is implemented as a PMOS high side power stage output driver and M6 is implemented as an NMOS low side power stage output driver. Power stage output driver 102 is driving a highly inductive load shown as inductor 111 and capacitor 113. Source of the high side transistors M5 is connected to a supply voltage Pvdd. In some embodiments, supply voltage Pvdd provides twelve volts DC power to transistors M5 and M6. However, other power supply voltages may be provided in other embodiments (e.g., such as voltages up to thirty volts DC or more). Drain terminal of M5 is connected to drain terminal of M6 and source terminal of M6 is connected to ground 107. Inductor 111 and is connected between transistor switch pairs M5 and M6 drain terminals at a first end and connected to capacitor 113 at a second end. Capacitor 113 is connected to ground 107.

Control loop 103C may provide a first pulse width modulated (PMW) control signal 104C to a gate terminal of transistor M5, and a second PMW control signal 104C to a gate terminal of transistor M6. During a stage of the switching cycle when M5 and M6 are both "off", a current 115 continues to flow through M5 and may cause an increase in local thermal dissipation within M5, resulting in an increase in temperature within M5.

FIG. 1C illustrates a power stage output driver 103 implemented in a boost converter. Construction of power stage output driver 103 is similar to construction of audio amplifier power stage output driver 101. In this regard, M7 is implemented as a PMOS high side power stage output driver and M8 is implemented as an NMOS low side power stage output driver. Power stage output driver 103 is connected to an inductive load shown as inductor 121 that is connected at one end to the drain terminals of M7 and M8 and connected to a positive terminal of DC source 123 at a second end. A negative terminal of DC source 123 is connected to ground 107. A source terminal of M7 is connected to capacitor 127 and Pvdd. Source terminal of M8 is connected to ground 107. Control loop 103D may provide a first pulse width modulated (PMW) control signal 104D to a gate terminal of transistor M7, and a second PMW control signal 104D to a gate terminal of transistor M8. During a stage of the switching cycle when M7 and M8 are both "off", a current 125 continues to flow through M7 and may cause an increase in local thermal dissipation within M7, resulting in an increase in temperature within M7.

FIGS. 2A-B illustrate schematic diagrams of exemplary high side power stage output drivers in accordance with one or more embodiments of the disclosure. FIG. 2A illustrates a power stage output driver 201 implemented with a PMOS high side driver M9 and an NMOS low side driver M10. In some embodiments, power stage output driver 201 is implemented in a semiconductor based substrate. PMOS high side driver source terminal is connected to power supply Pvdd. In some embodiments, Pvdd may provide twelve volts DC. However, in other embodiments, PVdd may provide up to thirty volts DC. Source terminal of M10 is connected to ground 107 and Nwell 205. Drain terminals of M9 and M10 may be connected to an inductor illustrated in FIG. 2A as a current source 211. Control loop 203A may provide a first pulse width modulated (PWM) control signal 204A to a gate terminal of transistor M9, and a second PMW control signal 204A to a gate terminal of transistor M10. During a stage of the switching cycle when M9 and M10 are both "off", a current 212 continues to flow through M9 via a body diode 217 and may cause an increase in local thermal dissipation within M9, resulting in an increase in temperature within a localized area of power stage output driver 201 near M9.

FIG. 2B illustrates a power stage output driver 202 implemented with an NMOS high side driver M11 and an NMOS low side driver M12. In some embodiments, power stage output driver 202 is implemented in a semiconductor based substrate. NMOS high side driver drain terminal is connected to power supply Pvdd. In some embodiments, Pvdd may provide twelve volts DC. However, in other embodiments, PVdd may provide up to thirty volts DC. Source terminal of M12 is connected to ground 107 and Nwell 205. Source terminal of M11 and drain terminal of M12 may be connected to an inductor illustrated in FIG. 2B as a current source 221. Control loop 203B may provide a first pulse width modulated (PMW) control signal 204B to a gate terminal of M11, and a second PMW control signal 204B to a gate terminal of M12. During a stage of the switching cycle when M11 and M12 are both "off", a current 222 continues to flow through high side NMOS M11 via a body diode 219 and may cause an increase in local thermal dissipation within M11, resulting in an increase in temperature within a localized area of power stage output driver 201 near M11. In this regard, utilizing semiconductor based high power devices M9-M10, and M11-M12 in power stage output drivers of semiconductor switching amplifiers that drive highly inductive loads may cause excessive thermal dissipation due to current flow through the high side MOS devices during switching cycles when both high side and low side power devices are "off".

Figure 3:
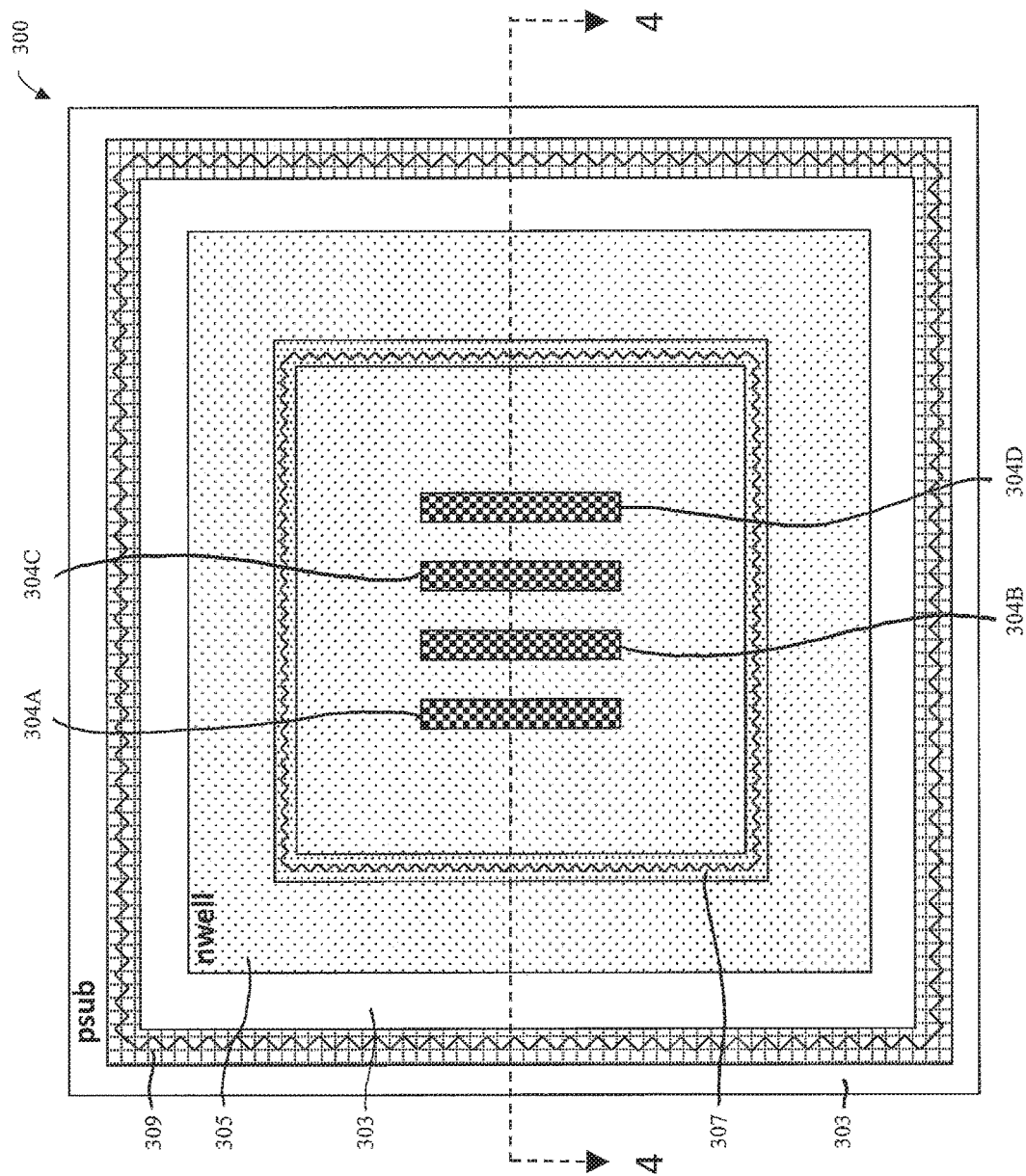
FIG. 3 illustrates an exemplary layout of a conventional PMOS high side power stage output driver.

FIG. 3 illustrates an exemplary layout of a conventional PMOS high side power stage output driver 300. As shown in FIG. 3, in some embodiments, a conventional PMOS high side power stage output driver 300 may be formed on a semiconductor p substrate such as psub 303. However, other substrate types are possible in other embodiments. In some embodiments, psub 303 may be biased at electrical ground. However, in other embodiments, psub 303 may be biased at a positive or negative voltage. An nwell structure 305 may be formed within psub 303. In some embodiments, nwell structure 305 may be biased at power supply Pvdd voltage. However, in other embodiments, nwell structure 305 may be biased at a different voltage. In some embodiments, Pvdd may be twelve volts DC. However, other DC voltages are possible, such as a range of voltages from approximately twelve volts DC to thirty volts DC. PMOS electronic power devices 304A-D (e.g., PMOS power devices 304A-D) may be formed on nwell structure 305. In some embodiments, four PMOS electronic devices 304 may be formed on nwell structure 305. However, in other embodiments, more or fewer PMOS electronic devices 304 may be formed on nwell structure 305.

An nwell guardring 307 may be formed on nwell structure 305. In some embodiments, nwell guardring 307 may be biased at power supply Pvdd voltage. However, in other embodiments, nwell guardring 307 may be biased at a different voltage. In some embodiments, nwell guardring 307 may surround all PMOS power devices 304A-D. In other embodiments, nwell guardring 307 may surround fewer than all PMOS power devices 304A-D, such as PMOS power devices 304A-C, or fewer. In some embodiments, a psub guardring 309 may be formed on psub 303 and may surround nwell structure 305. In some embodiments, psub guardring 309 may be biased at electrical ground. However, in other embodiments, psub guardring 309 may be biased at a positive or negative voltage.

Figure 4:
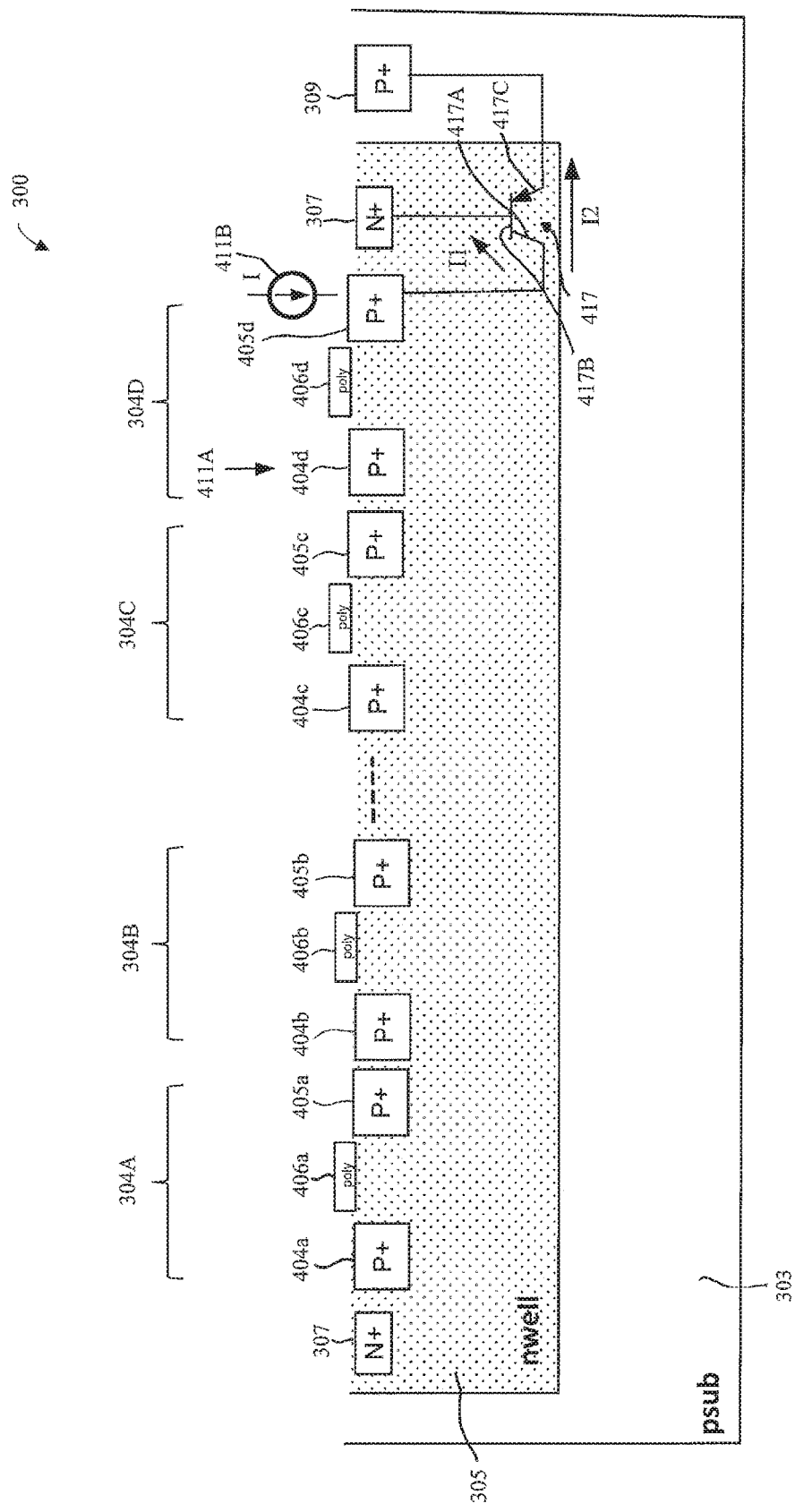
FIG. 4 illustrates an exemplary cross-section of a conventional PMOS high side power stage output driver.

FIG. 4 illustrates an exemplary cross-section of a conventional PMOS high side power stage output driver 300. As shown, cross-section of conventional PMOS high side power stage output driver 300 includes psub 303, and nwell structure 305 formed within psub 303. PMOS electronic devices 304A-D are formed on nwell structure 305. Each of PMOS electronic devices 304A-D includes a source implant 404 (e.g., shown as 404a-d), a drain implant 405 (e.g., shown as 405a-d), and a gate control terminal 406 (e.g., shown as 406a-d and identified as poly in FIG. 4). In some embodiments, nwell guardring 307 is formed on nwell structure 305 and is biased to Pvdd. In other embodiments, nwell guardring 307 is biased to a voltage less than Pvdd. Psub guardring 309 is formed on psub 303 and is biased to ground. In other embodiments, psub guardring 309 is biased to a voltage less than or the same as Pvdd.

Current 411A flows from source implant 404d to drain implant 405d and to an inductive load (e.g., inductive speaker load 135 of FIG. 1A, for example) when high side PMOS power device 304D is "on". During switching cycles when both high side and low side power devices are "off", as discussed herein, current 411B flows from drain implant 405d to nwell guardring 307 and psub guardring 309 through parasitic PNP device 417. Current 411B flows into parasitic PNP device 417 and is split into currents I1 and I2, as shown in FIG. 4. Parasitic PNP device 417 is shown in FIG. 4 with collector 417A connected to drain implant 405d, base 417B connected to nwell guardring 307, and emitter 417C connected to psub guardring 309. In this regard, current I1 flows to nwell guardring 307 and current I2 flows to psub guardring 309. The total power dissipation due to current 411B in psub 303 during the "off" cycle is given by equation 1.1.

$$\text{Power} = I1 \times 0.7 + I2 \times 12.7 \qquad \text{equation 1.1}$$

Term 0.7 in equation 1.1 is parasitic PNP device 417 emitter-to-base voltage and term 12.7 in equation 1.1 is parasitic PNP device 417 emitter-to-collector voltage. In some embodiments, parasitic PNP device 417 emitter-to-base voltage may be greater than or less than approximately 0.7 volts, the voltage based on physical and electrical properties of parasitic PNP device 417. In some embodiments, parasitic PNP device 417 emitter-to-collector voltage may be greater than or less than approximately 12.7 volts, the voltage based on physical and electrical properties of parasitic PNP device 417, and voltage bias of nwell guardring 307, as discussed herein. As shown, the majority of power dissipation is due to current I2, and thermal dissipation (e.g., and temperature increase in psub 303) may be caused primarily by current I2. In this regard, assuming a beta of one or two for parasitic PNP device 417, power consumed at emitter-to-collector of parasitic PNP device 417 is approximately twelve to twenty four times greater than emitter-to-base. High power consumption in localized areas of conventional PMOS high side power stage output driver 300 creates a serious concern for heat related snapback or breakdown risk. Therefore, reducing current I2 is key to reducing thermal dissipation, and subsequent loss of efficiency and reliability of conventional PMOS high side power stage output driver 300.

Figure 5:
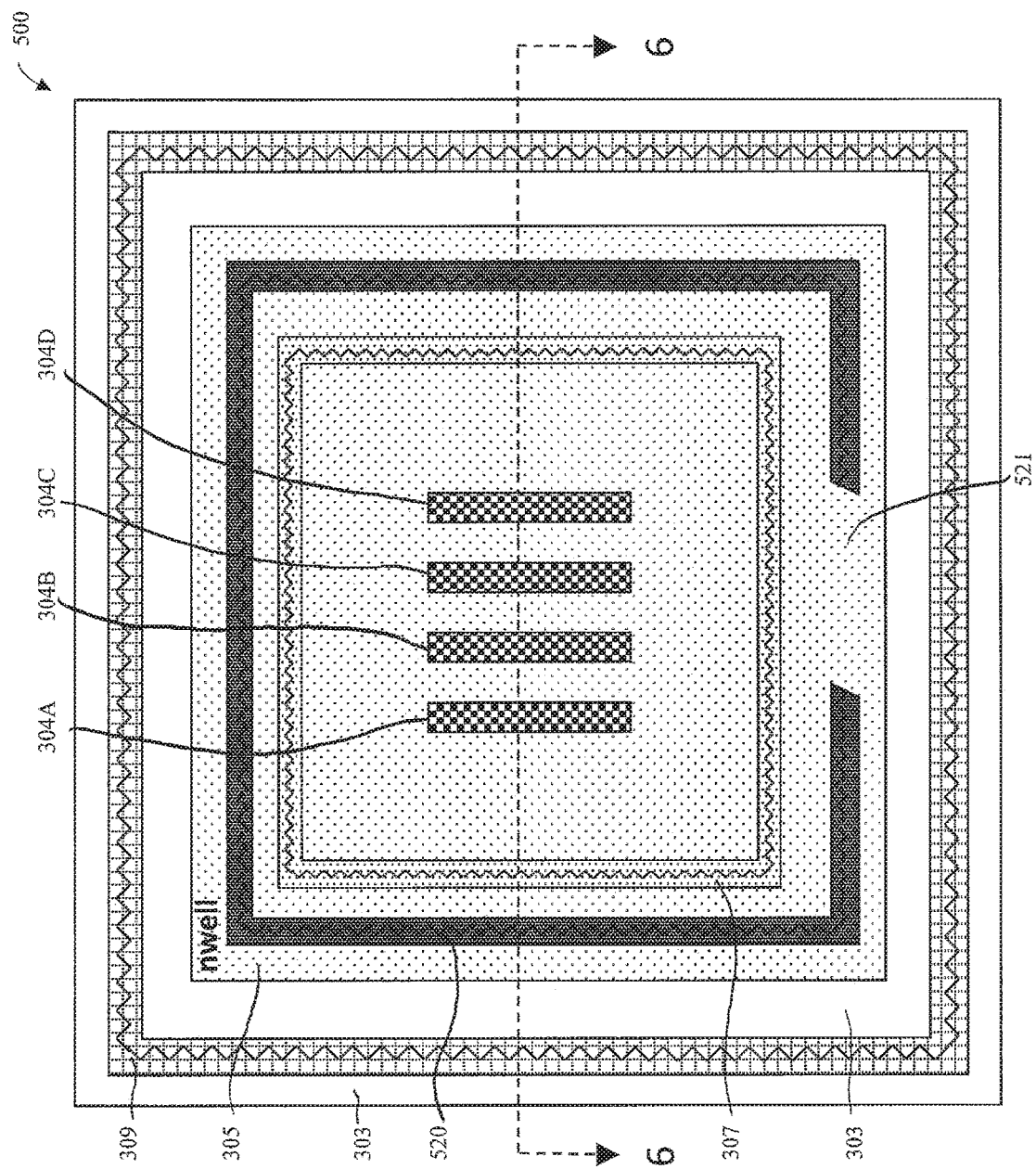
FIG. 5 illustrates an exemplary layout of a $P^+$ guardring enhanced PMOS high side power stage output driver in accordance with one or more embodiments of the disclosure.

FIG. 5 illustrates an exemplary layout of a P$^+$ guardring enhanced PMOS high side power stage output driver 500 in accordance with one or more embodiments of the disclosure. P$^+$ guardring enhanced PMOS high side power stage output driver 500 comprises a power MOS structure. P$^+$ guardring enhanced PMOS high side power stage output driver 500 is similar to and includes all features of layout, construction, and voltage biases of conventional PMOS high side power stage output driver 300, as described herein. In addition, P$^+$ guardring enhanced PMOS high side power stage output driver 500 includes a p+ guardring 520 formed on nwell structure 305 and configured to surround nwell guardring 307. In some embodiments, p+ guardring 520 fully surrounds nwell guardring 307. In other embodiments, p+ guardring 520 partially surrounds nwell guardring 307, forming a gap 521 within p+ guardring 520. It is understood gap 521 is not included in some embodiments such as when p+ guardring 520 fully surrounds nwell guardring 307. In some embodiments, p+ guardring 520 is set at the same voltage of nwell structure 305. In other embodiments, p+ guardring 520 is set at a lower voltage of nwell structure 305.

Figure 6:
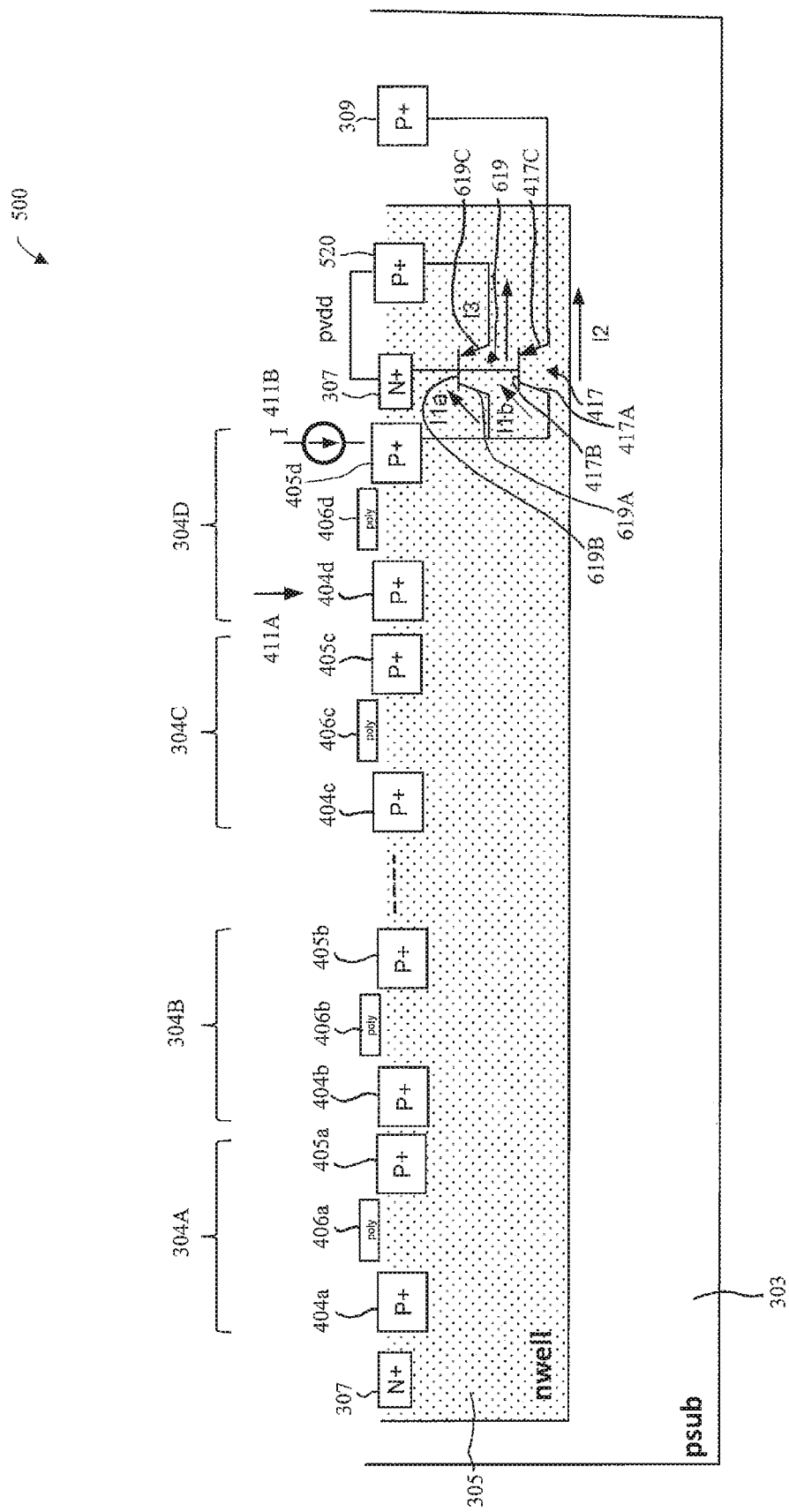
FIG. 6 illustrates an exemplary cross-section of a $P^+$ guardring enhanced PMOS high side power stage output driver in accordance with one or more embodiments of the disclosure.

FIG. 6 illustrates an exemplary cross-section of a P$^+$ guardring enhanced PMOS high side power stage output driver 500 in accordance with one or more embodiments of the disclosure. As shown, cross-section of P$^+$ guardring enhanced PMOS high side power stage output driver 500 includes psub 303, and nwell structure 305 formed within psub 303. PMOS electronic devices 304A-D are formed on nwell structure 305. Each of PMOS electronic devices 304A-D includes a source implant 404 (e.g., shown as 404a-d), a drain implant 405 (e.g., shown as 405a-d), and a gate control terminal 406 (e.g., shown as 406a-d and identified as poly in FIG. 6). In some embodiments, nwell guardring 307 is formed on nwell structure 305 and is biased to Pvdd. In other embodiments, nwell guardring 307 is biased to a voltage less than Pvdd. Psub guardring 309 is formed on psub 303 and is biased to ground. In other embodiments, psub guardring 309 is biased to a voltage less than or the same as Pvdd. FIG. 6 additionally shows p+ guardring 520, and, in some embodiments, p+ guardring 520 is biased at the same voltage of nwell structure 305. In other embodiments, p+ guardring 520 is set at a lower voltage of nwell structure 305.

Current 411A flows from source implant 404d to drain implant 405d and to an inductive load (e.g., inductive speaker load 135 of FIG. 1A, for example) when high side PMOS power device 304D is "on". During switching cycles when both high side and low side power devices are "off", as discussed herein, current 411B flows from drain implant 405d to nwell guardring 307 and psub guardring 309 through parasitic PNP device 417, and to nwell guardring 307 and p+ guardring 520 through parasitic PNP device 619. Parasitic PNP device 619 is added due to addition of p+ guardring 520 to further split current 411B and reduce current I2 to significantly lower power and thermal dissipation. In this regard, current 411B is split into currents I1a, I1b, I2 and I3, and shared between parasitic PNP device 417 and parasitic PNP device 619 as shown in FIG. 6. Parasitic PNP device 619 is shown with collector 619A connected to drain implant 405d, base 619B connected to nwell guardring 307, and emitter 417C connected to p+ guardring 520. Parasitic PNP device 417 is shown with collector 417A connected to drain implant 405d, base 417B connected to nwell guardring 307, and emitter 417C connected to psub guardring 309. In this regard, currents I1a and I1b flow to nwell guardring 307, current I2 flows to psub guardring 309, and current I3 flows to p+ guardring 520. The total power dissipation due to current 411B in psub 303 during the "off" cycle is given by equation 1.2.

$$\text{Power} = (I1a + I1b) \times 0.7 + I2 \times 12.7 + I3 \times 0.7 \quad \text{equation 1.2}$$

Term 0.7 used with I1a and I1b in equation 1.2 is parasitic PNP device 417 and parasitic PNP device 619 emitter-to-base voltages. Term 0.7 used with I3 in equation 1.2 is parasitic PNP device 619 emitter-to-base voltage. Term 12.7 in equation 1.2 is parasitic PNP device 417 emitter-to-collector voltage. In some embodiments, parasitic PNP device 417 and parasitic PNP device 619 emitter-to-base voltages, and parasitic PNP device 619 emitter-to-base voltage may be greater than or less than approximately 0.7 volts, the voltage based on physical and electrical properties of parasitic PNP device 417 and parasitic PNP device 619. In some embodiments, parasitic PNP device 417 emitter-to-collector voltage may be greater than or less than approximately 12.7 volts, the emitter-to-collector voltage being based on physical and electrical properties of parasitic PNP device 417, and voltage bias of nwell guardring 307, as discussed herein.

As discussed herein, the majority of power dissipation is due to current I2, and thermal dissipation (e.g., and temperature increase in psub 303) may be caused primarily by current I2. A parallel parasitic PNP device 619 formed by adding p+ guardring 520 provides for additional current path I3 to divert current 411B and thereby reduce current I2. Beta of added parallel parasitic PNP device 619 is greater than that of parasitic PNP device 417. A voltage drop of parallel parasitic PNP device 619 is approximately 0.7 v, which is significantly less than Pvdd, to effect a reduction in power loss and improve reliability and efficiency.

Figure 7:
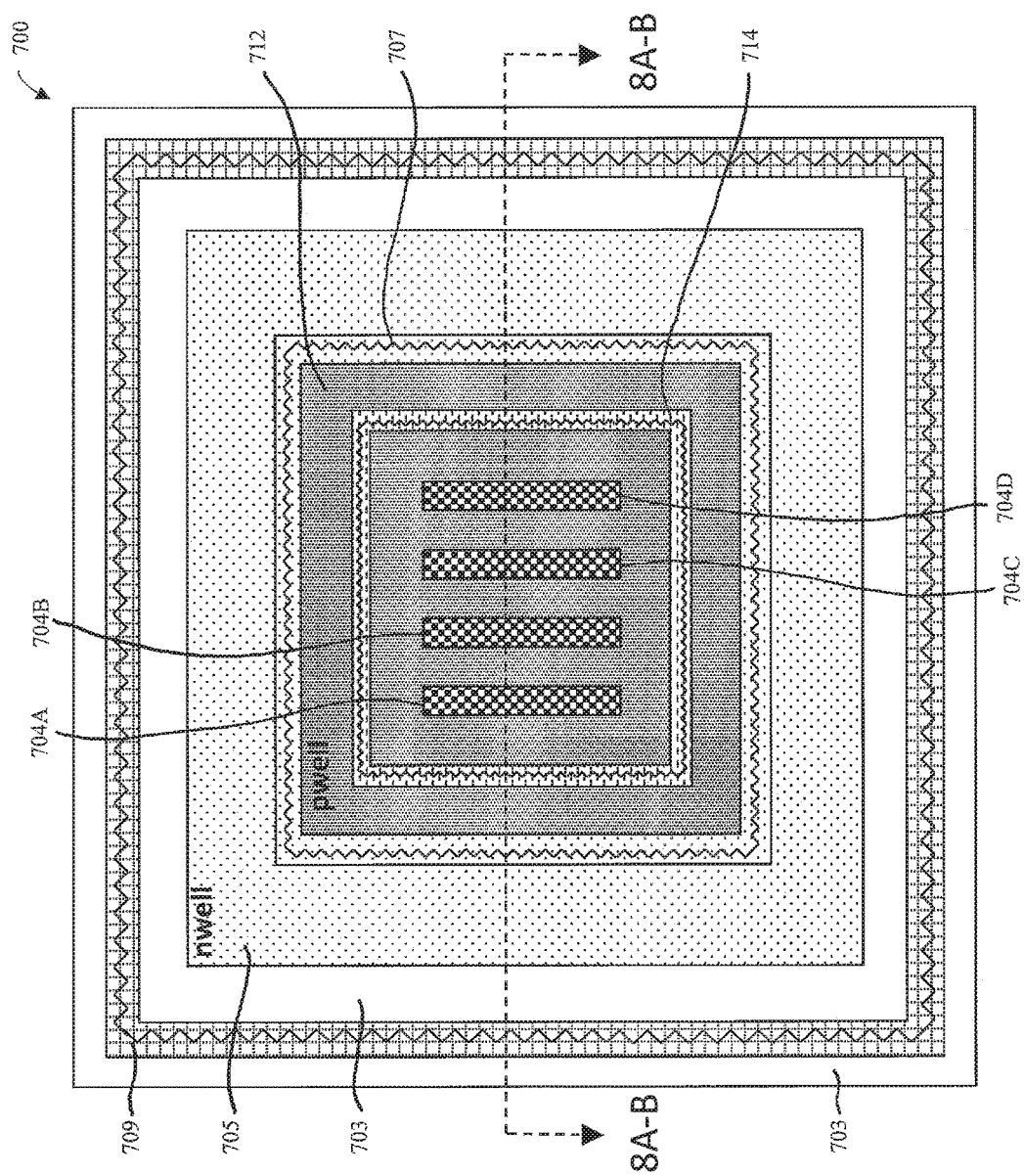
FIG. 7 illustrates an exemplary layout of a conventional NMOS high side power stage output driver.

FIG. 7 illustrates an exemplary layout of a conventional NMOS high side power stage output driver 700. As shown in FIG. 7, in some embodiments, a conventional NMOS high side power stage output driver 700 may be formed on a semiconductor substrate, such as psub 703. However, other substrate types are possible in other embodiments. In some embodiments, psub 703 may be biased at electrical ground. However, in other embodiments, psub 703 may be biased at a positive or negative voltage. A deep nwell structure 705 may be formed within psub 703. In some embodiments, deep nwell structure 705 may be biased at power supply Pvdd voltage. However, in other embodiments, deep nwell structure 705 may be biased at a different voltage. In some embodiments, Pvdd may be twelve volts DC. However, other DC voltages are possible, such as a range of voltages from approximately twelve volts DC to thirty volts DC. A pwell structure 712 may be formed within deep nwell structure 705. In some embodiments, pwell structure 712 may be biased at power supply Pvdd voltage. However, in other embodiments, pwell structure 712 may be biased at a different voltage. A deep nwell guardring 707 may be formed on deep nwell structure 705 and surrounds pwell structure 712. In some embodiments, deep nwell guardring 707 may be biased at power supply Pvdd voltage. However, in other embodiments, deep nwell guardring 707 may be biased at a different voltage.

NMOS electronic power devices 704A-D (e.g., NMOS power devices 704A-D) may be formed on pwell structure 712. In some embodiments, four NMOS electronic devices 704 may be formed on pwell structure 712. However, in other embodiments, more or fewer NMOS electronic devices 704 may be formed on pwell structure 712. In some embodiments, a pwell guardring 714 may surround all NMOS power devices 704A-D. In other embodiments, pwell guardring 714 may surround fewer than all NMOS power devices 704A-D, such as NMOS power devices 704A-C, or fewer. In some embodiments, a psub guardring 709 may be formed on psub 703 and may surround deep nwell structure 705. In some embodiments, psub guardring 709 may be biased at electrical ground. However, in other embodiments, psub guardring 709 may be biased at a positive or negative voltage.

Figure 8A:
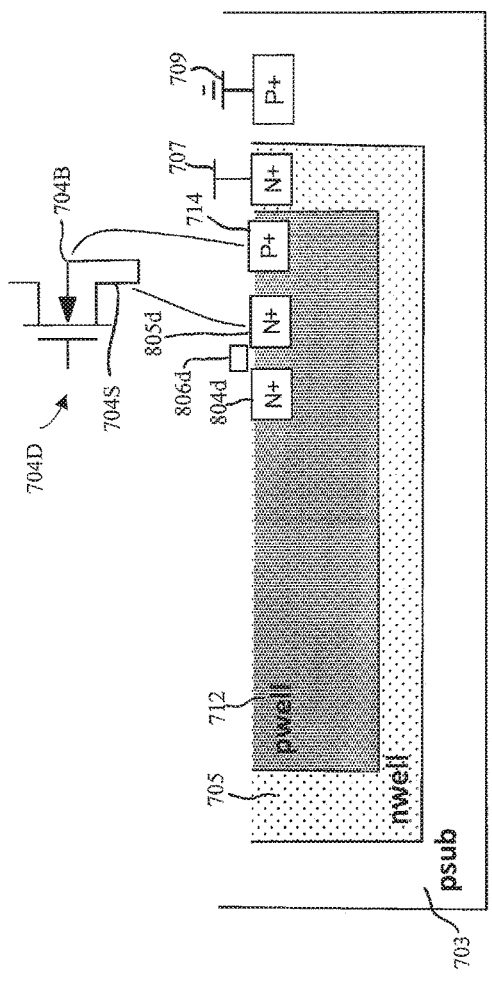
FIGS. 8A-B illustrate exemplary cross-sections of a conventional NMOS high side power stage output driver.
Figure 8B:
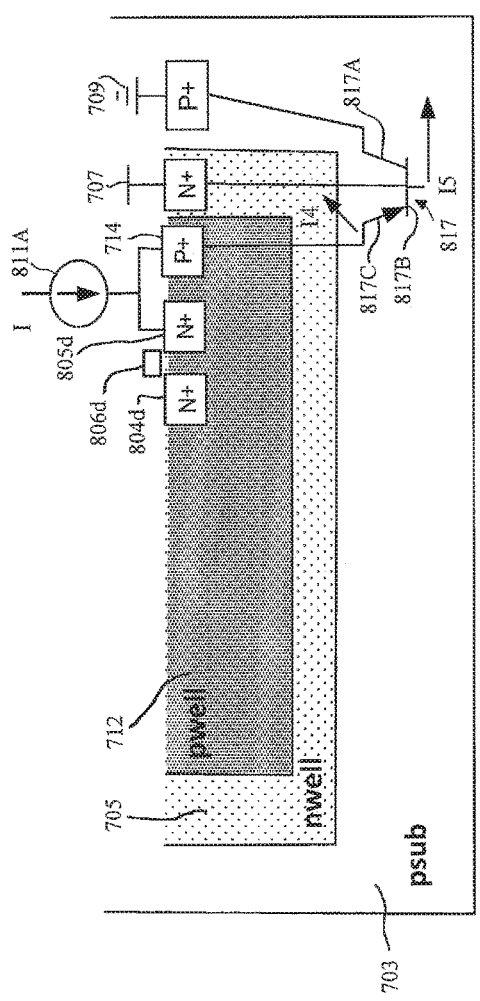

FIGS. 8A-B illustrate exemplary cross-sections of a conventional NMOS high side power stage output driver 700. As shown in FIG. 8A, cross-section of conventional NMOS high side power stage output driver 700 includes psub 703, and deep nwell structure 705 formed within psub 703. High side NMOS electronic device 704D is formed on pwell structure 712. NMOS electronic device 704D includes a source 704S connected to source terminal n⁺ implant 805d, and a body 704B connected to pwell guardring 714. Pwell structure 712 includes a drain terminal n⁺ implant 804d, source terminal n⁺ implant 805d, a gate control terminal 806d, and pwell guardring 714. In some embodiments, deep nwell guardring 707 is formed on deep nwell structure 705 and is biased to Pvdd. In other embodiments, deep nwell guardring 707 is biased to a voltage less than Pvdd. Psub guardring 709 is formed on psub 703 and is biased to ground. In other embodiments, psub guardring 709 is biased to a voltage less than or the same as Pvdd.

Referring now to FIG. 8B, source terminal n⁺ implant 805d provides current 811A to an inductive load (e.g., inductive speaker load 135 of FIG. 1A, for example) when high side NMOS power device 704D is "on" and conducting. During switching cycles when both high side and low side power devices are "off", as discussed herein, current 811A flows through pwell guardring 714. Current 811A flows into parasitic PNP device 817 and is split into currents I4 and I5, as shown in FIG. 8B. Parasitic PNP device 817 is shown in FIG. 8B with collector 817A connected to psub guardring 709, base 817B connected to deep nwell guardring 707, and emitter 817C connected to pwell guardring 714. In this regard, current I4 flows to deep nwell guardring 707 and current I5 flows to psub guardring 709. The total power dissipation due to current 811A in psub 703 during the "off" cycle is given by equation 1.3.

$$\text{Power} = I4 \times 0.7 + I5 \times 12.7 \quad \text{equation 1.3}$$

Term 0.7 in equation 1.3 is parasitic PNP device 817 emitter-to-base voltage and term 12.7 in equation 1.3 is parasitic PNP device 817 emitter-to-collector voltage. In some embodiments, parasitic PNP device 817 emitter-to-base voltage may be greater than or less than approximately 0.7 volts, the emitter-to-base voltage being based on physical and electrical properties of parasitic PNP device 817. In some embodiments, parasitic PNP device 817 emitter-to-collector voltage may be greater than or less than approximately 12.7 volts, the voltage based on physical and electrical properties of parasitic PNP device 817, and voltage bias of deep nwell guardring 707, as discussed herein. As shown, the majority of power dissipation is due to current I5, and thermal dissipation (e.g., and temperature increase in psub 703) may be caused primarily by current I5. In this regard, assuming a beta of one or two for parasitic PNP device 817, power consumed at emitter-to-collector is approximately twelve to twenty four times greater than emitter-to-base. High power consumption in localized areas of conventional NMOS high side power stage output driver 700 creates a serious concern for heat related snapback or breakdown risk. Therefore, reducing current I5 is key to reducing thermal dissipation, and subsequent loss of efficiency and reliability of conventional NMOS high side power stage output driver 700.

Figure 9:
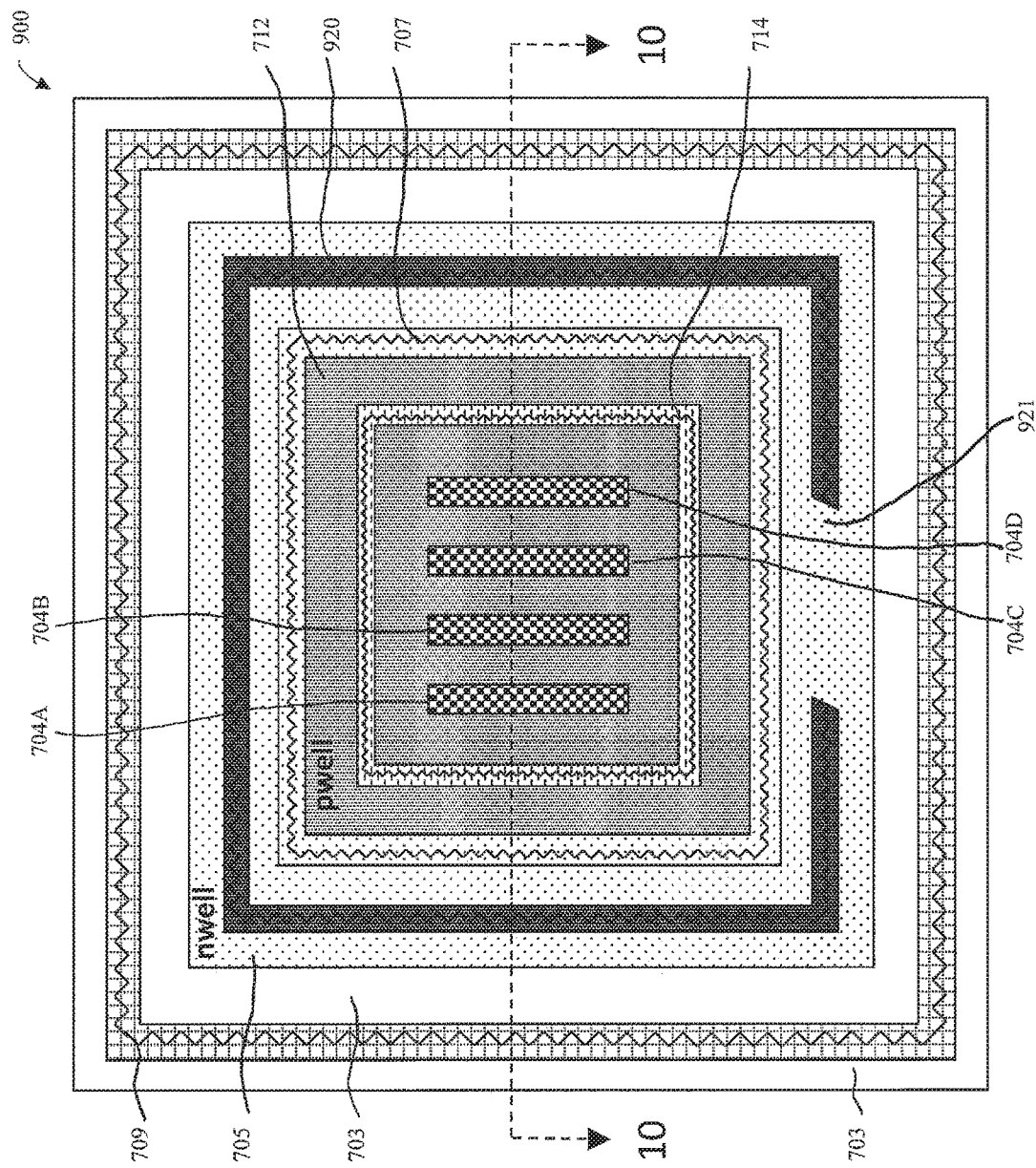
FIG. 9 illustrates an exemplary layout of a $P^+$ guardring enhanced NMOS high side power stage output driver in accordance with one or more embodiments of the disclosure.

FIG. 9 illustrates an exemplary layout of a P$^+$ guardring enhanced NMOS high side power stage output driver 900 in accordance with one or more embodiments of the disclosure. P$^+$ guardring enhanced NMOS high side power stage output driver 900 comprises a power device (e.g., MOS) structure. P$^+$ guardring enhanced NMOS high side power stage output driver 900 is similar to and includes all features of layout, construction, and voltage biases of conventional NMOS high side power stage output driver 700, as described herein. In addition, P$^+$ guardring enhanced NMOS high side power stage output driver 900 includes a p+ guardring 920 formed on deep nwell structure 705 and configured to surround deep nwell guardring 707. In some embodiments, p+ guardring 920 fully surrounds deep nwell guardring 707. In other embodiments, p+ guardring 920 partially surrounds deep nwell guardring 707, forming a gap 921 within p+ guardring 920. It is understood gap 921 is not included in some embodiments, such as when p+ guardring 920 fully surrounds deep nwell guardring 707. In some embodiments, p+ guardring 920 is set at the same voltage of deep nwell structure 705. In other embodiments, p+ guardring 920 is set at a lower voltage of nwell structure 305.

Figure 10:
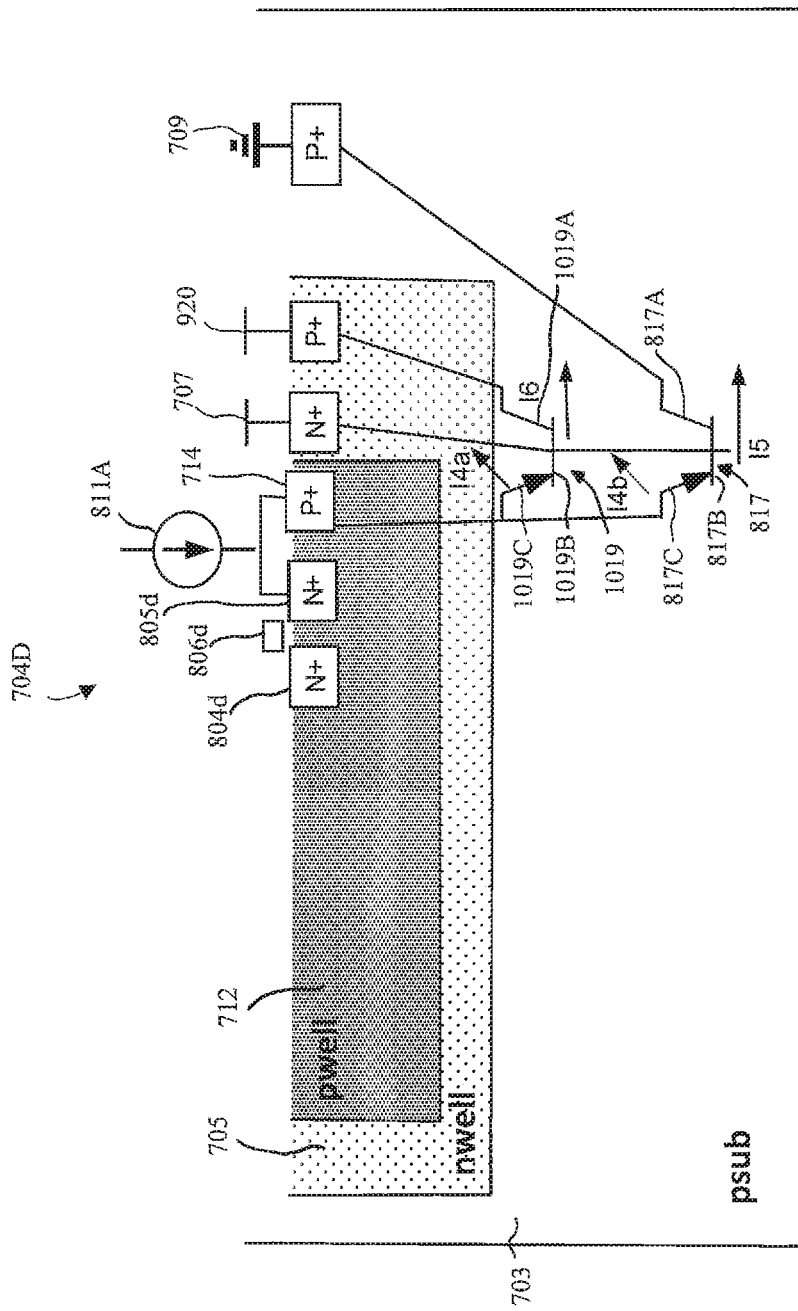
FIG. 10 illustrates an exemplary cross-section of a $P^+$ guardring enhanced NMOS high side power stage output driver in accordance with one or more embodiments of the disclosure.

FIG. 10 illustrates an exemplary cross-section of a P$^+$ guardring enhanced NMOS high side power stage output driver 900 in accordance with one or more embodiments of the disclosure. As shown, cross-section of P$^+$ guardring enhanced NMOS high side power stage output driver 900 includes psub 703, and deep nwell structure 705 formed on psub 703. Pwell structure 712 is formed within deep nwell structure 705 and includes NMOS electronic device 804D structure. In this regard, pwell structure 712 includes a drain terminal n$^+$ implant 804d, a source terminal n$^+$ implant 805d, a gate control terminal 806d, and pwell guardring 714.

During switching cycles when both high side and low side power devices are "off", as discussed herein, current 811A flows through pwell guardring 714. Current 811A flows into parasitic PNP device 817 and parasitic PNP device 1019. Parasitic PNP device 1019 is added due to incorporation of p+ guardring 920 to further split current 811A and reduce current I5 to significantly lower power and thermal dissipations. In this regard, current 811A is split into currents I4a, I4b, I5 and I6, and shared between parasitic PNP device 817 and parasitic PNP device 1019 as shown in FIG. 10. Parasitic PNP device 1019 is shown with collector 1019A connected to p+ guardring 920, base 1019B connected to deep nwell guardring 707, and emitter 1019C connected to pwell guardring 714. Parasitic PNP device 817 is shown with collector 817A connected to psub guardring 709, base 817B connected to deep nwell guardring 707, and emitter 817C connected to pwell guardring 714. In this regard, currents I4a and I4b flow to deep nwell guardring 707, current I5 flows to psub guardring 709, and current I6 flows to p+ guardring 920. The total power dissipation due to current 811A in psub 703 during the "off" cycle is given by equation 1.4.

$$\text{Power} = (I4a + I4b) \times 0.7 + I5 \times 12.7 + I6 \times 0.7 \quad \text{equation 1.4}$$

Term 0.7 used with I4a and I4b in equation 1.4 is parasitic PNP device 817 and parasitic PNP device 1019 emitter-to-base voltages. Term 0.7 used with I6 in equation 1.4 is parasitic PNP device 1019 collector-to-base voltage. Term 12.7 in equation 1.4 is parasitic PNP device 817 emitter-to-collector voltage. In some embodiments, parasitic PNP device 817 and parasitic PNP device 1019 emitter-to-base voltages, and parasitic PNP device 1019 collector-to-base voltage may be greater than or less than approximately 0.7 volts, the voltage based on physical and electrical properties of parasitic PNP device 817 and parasitic PNP device 1019. In some embodiments, parasitic PNP device 817 collector-to-emitter voltage may be greater than or less than approximately 12.7 volts, the emitter-to-collector voltage being based on physical and electrical properties of parasitic PNP device 817, and voltage bias of deep nwell guardring 707, as discussed herein.

As discussed herein, the majority of power dissipation is due to current I5, and thermal dissipation (e.g., and temperature increase in psub 703) may be caused primarily by current I5. A parallel parasitic PNP device 1019 formed by adding p+ guardring 920 provides for additional current path I6 to divert current 811A and thereby reduce current I5. Beta of added parallel parasitic PNP device 1019 is greater than that of parasitic PNP device 817. A voltage drop of parallel parasitic PNP device 1019 is approximately 0.7 v, which is significantly less than Pvdd, to effect a reduction in power loss and improve reliability and efficiency.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A system comprising:
 a power metal oxide semiconductor (MOS) structure comprising:
  a p substrate;
  an nwell structure formed within the p substrate;
  one or more p-channel metal oxide semiconductor (PMOS) electronic power devices formed on the nwell structure;
  an nwell guardring formed within the nwell structure, the nwell guardring surrounding the one or more PMOS electronic power devices; and
  a p+ guardring formed within the nwell structure, the p+ guardring surrounding the nwell guardring.

2. The system of claim 1, wherein the p+ guardring is configured to fully surround the nwell guardring, and wherein the nwell guardring is configured to fully surround at least one of the one or more PMOS electronic power devices.

3. The system of claim 1, wherein the p+ guardring is configured to partially surround the nwell guardring forming a gap on at least one side of the p+ guardring.

4. The system of claim 1, wherein a voltage of the p+ guardring is at a same voltage of the nwell structure.

5. The system of claim 1, wherein a voltage of the p+ guardring is lower than a voltage of the nwell structure.

6. The system of claim 1, further comprising a p substrate guardring formed on the p substrate and configured to surround the nwell structure.

7. A method of forming a substrate comprising:
 forming a p substrate;
 forming an nwell structure within the p substrate;
 forming one or more p-channel metal oxide semiconductor (PMOS) electronic power devices on the nwell structure;
 forming an nwell guardring within the nwell structure, the nwell guardring surrounding the one or more PMOS electronic power devices; and
 forming a p+ guardring within the nwell structure, the p+ guardring surrounding the nwell guardring.

8. The method of claim 7, further comprising:
 fully surrounding the nwell guardring via the p+ guardring; and
 fully surrounding at least one of the one or more PMOS electronic power devices via the p+ guardring.

9. The method of claim 7, further comprising:
 partially surrounding the nwell guardring via the p+ guardring.

10. The method of claim 7, wherein the p+ guardring comprises a voltage no greater than a voltage of the nwell structure, the method further comprising forming a p substrate guardring on the p substrate and surrounding the nwell structure.

* * * * *